（12） United States Patent
Hwang

(10) Patent No.: US 8,519,464 B2
(45) Date of Patent: Aug. 27, 2013

(54) NON-VOLATILE MEMORY DEVICE AND METHOD FOR FABRICATING THE SAME

(75) Inventor: Joo-Won Hwang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 98 days.

(21) Appl. No.: 13/159,841

(22) Filed: Jun. 14, 2011

(65) Prior Publication Data

US 2012/0228692 A1    Sep. 13, 2012

(30) Foreign Application Priority Data

Mar. 7, 2011 (KR) .................. 10-2011-0019866

(51) Int. Cl.
*H01L 29/76* (2006.01)
(52) U.S. Cl.
USPC .............. 257/314; 438/257; 257/E21.68
(58) Field of Classification Search
USPC ........... 438/201, 277, 288; 257/314, 315, 257/E21.68
See application file for complete search history.

(56) References Cited

U.S. PATENT DOCUMENTS 7,387,934 B2 *   6/2008   Ozawa et al. ............... 438/258

FOREIGN PATENT DOCUMENTS

| KR | 1020060083509 | 7/2006 |
| KR | 1020080061195 | 7/2008 |

OTHER PUBLICATIONS

Office Action issued by the Korean Intellectual Property Office on Jun. 12, 2012.

* cited by examiner

*Primary Examiner* — Quoc Hoang
(74) *Attorney, Agent, or Firm* — IP & T Group LLP

(57) ABSTRACT

A non-volatile memory device includes a plurality of stacked patterns where a tunnel insulation layer, a floating gate, and a dielectric layer are sequentially stacked over a substrate, trenches formed in the substrate between the stacked patterns, an isolation layer gap-filling the trenches and space between the stacked patterns, and a control gate formed over the dielectric layer.

19 Claims, 5 Drawing Sheets

NON-VOLATILE MEMORY DEVICE AND METHOD FOR FABRICATING THE SAME

CROSS-REFERENCE TO RELATED APPLICATIONS

The present application claims priority of Korean Patent Application No. 10-2011-0019866, filed on Mar. 7, 2011, which is incorporated herein by reference in its entirety.

BACKGROUND

1. Field

Exemplary embodiments of the present invention relate to a method for fabricating a semiconductor device, and more particularly, to a non-volatile memory device and a method for fabricating the same.

2. Description of the Related Art

A non-volatile memory device retains data stored therein although a power supply is cut off. Different types of non-volatile memory devices, such as flash memory, are being widely used.

FIG. 1 is a cross-sectional device illustrating a conventional non-volatile memory device.

Referring to FIG. 1, the conventional non-volatile memory device includes an isolation layer 12, a floating gate 15, a tunnel insulation layer 14, a dielectric layer 16, and a control gate 17. The isolation layer 12 is formed over a substrate 11 to define a plurality of active regions 13. The floating gate 15 is formed over each of the active regions 13 to have a surface higher than the isolation layer 12 with respect to the substrate 11. The tunnel insulation layer 14 is interposed between the floating gate 15 and the active regions 13. The dielectric layer 16 is formed along the surface of the substrate structure including the floating gate 15. The control gate 17 is formed over the dielectric layer 16.

In order to secure a proper coupling ratio, the dielectric layer 16 is formed along the surface of the floating gate 15 protruding from the isolation layer 12. As a result, the interference may be caused between adjacent cells 101 by a parasitic capacitance, particularly, the parasitic capacitance between the floating gate 15 and the dielectric layer 16 that are disposed adjacently to each other, and the characteristics of the non-volatile memory device may deteriorate. The characteristics of the non-volatile memory device may deteriorate more as the integration degree of a semiconductor device increases and the gap between the adjacent cells 101 becomes narrower.

SUMMARY

An embodiment of the present invention is directed to a non-volatile memory device that may prevent the characteristics of the non-volatile memory device from being deteriorated due to the interference between adjacent cells and a method for fabricating the non-volatile memory device.

In accordance with an embodiment of the present invention, a non-volatile memory device includes: a plurality of stacked patterns including a tunnel insulation layer, a floating gate, and a dielectric layer sequentially stacked and formed over a substrate; trenches formed in the substrate between the stacked patterns; an isolation layer gap-filling the trenches and space between the stacked patterns; and a control gate formed over the dielectric layer.

In accordance with another embodiment of the present invention, a method for fabricating a non-volatile memory device includes: forming a plurality of stacked patterns where a tunnel insulation layer, a floating gate, a dielectric layer, and a capping layer are sequentially stacked over a substrate; forming trenches by etching the substrate between the stacked patterns; forming an isolation layer gap-filling the trenches and space between the stacked patterns; and forming a control gate over the stacked patterns.

In accordance with further embodiment of the present invention, a method for fabricating a non-volatile memory device includes: forming floating gates over active regions of a substrate; forming an isolation layer by gap-filling spaces between the floating gates and between the active regions of the substrate, wherein surfaces of the floating gates are aligned with a surface of the isolation layer; and forming a control gate over the aligned surface.

DETAILED DESCRIPTION

Figure 1:
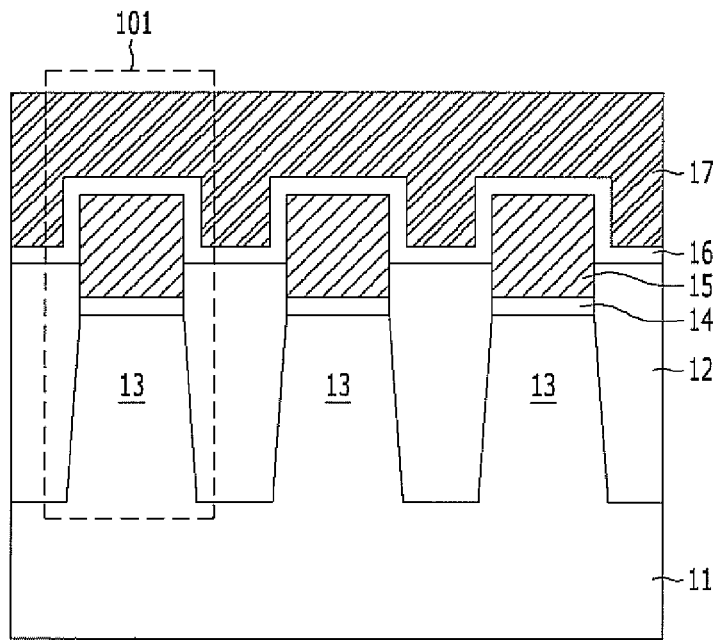
FIG. 1 is a cross-sectional view illustrating a conventional non-volatile memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Provided hereafter are a non-volatile memory device that may prevent its characteristics from being deteriorated due to the interference between adjacent cells and a method for fabricating the non-volatile memory device. The interference between adjacent cells is caused by the parasitic capacitance between them, in particular, the parasitic capacitance between a floating gate and a dielectric layer that are adjacent to each other. Therefore, in an embodiment of the present invention, the characteristics of a non-volatile memory device is protected/prevented from being deteriorated due to the interference by removing the parasitic capacitance generated between the adjacent floating gate and dielectric layer.

Figure 2:
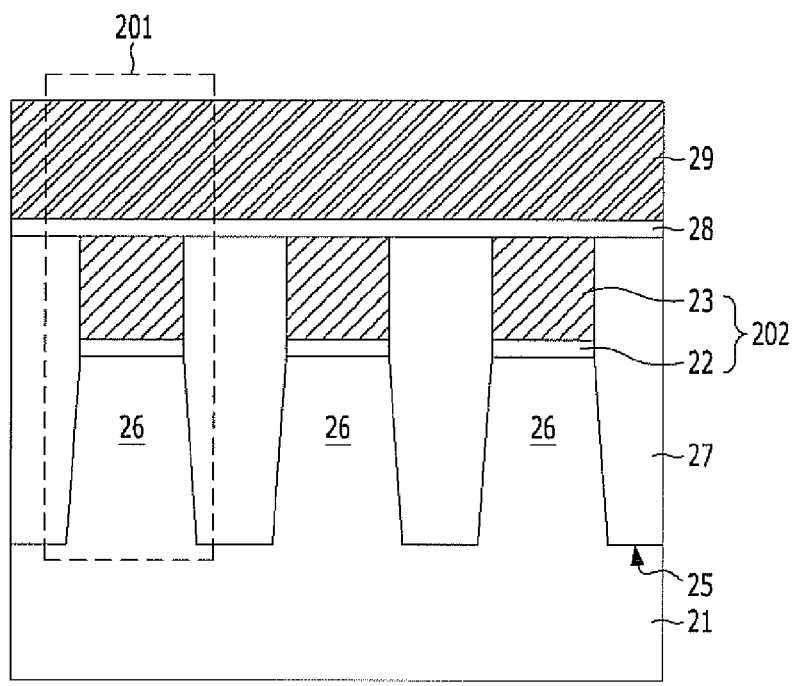
FIG. 2 is a cross-sectional view illustrating a non-volatile memory device in accordance with a first embodiment of the present invention.

FIG. 2 is a cross-sectional view illustrating a non-volatile memory device in accordance with a first embodiment of the present invention.

Referring to FIG. 2, the non-volatile memory device in accordance with the first embodiment of the present invention includes: a plurality of stacked patterns 202, trenches 25, an isolation layer 27, a dielectric layer 28, and a control gate 29. The stacked patterns 202 are formed over a substrate 21 of active regions 26 and formed by sequentially stacking a tunnel insulation layer 22 and a floating gate 23. The trenches 25 are formed over the substrate 21 between the stacked patterns 202. The isolation layer 27 gap-fills the trenches 25 between the stacked patterns 202 and defines the active regions 26. The dielectric layer 28 is formed over the substrate 21. The control gate 29 is formed over the dielectric layer 28. Here, the surface of the stacked patterns 202, that is, the surface of the floating gate 23, and the surface of the isolation layer 27 are disposed at the same height from the substrate 21 to form a planar surface, and the dielectric layer 28 is disposed on the planar surface.

The non-volatile memory device in accordance with the first embodiment of the present invention may remarkably reduce the parasitic capacitance occurring between the adjacent floating gate 23 and dielectric layer 28 and prevent the interference from being caused by the parasitic capacitance between the adjacent floating gate 23 and dielectric layer 28.

To be specific, sine the floating gate 15 protrudes from the isolation layer 12 and the dielectric layer 16 is formed along the surface of the isolation layer 12 and the surface of the floating gate 15 in FIG. 1, the contact area (which may be referred to as an overlap area) between the floating gate 15 and the dielectric layer 16 is relatively large. The large contact area may cause a great parasitic capacitance between the adjacent floating gate 23 and dielectric layer 28. On the other hand, according to the embodiment of the present invention, the surface of the isolation layer 27 and the surface of the floating gate 23 are disposed at the same height. Since the dielectric layer 28 is formed on a planar surface, the contact area between the floating gate 23 and the dielectric layer 28 may be reduced considerably, compared with that of the conventional non-volatile memory device. As described above, since the contact area between the floating gate 23 and the dielectric layer 28 is decreased, the amount of parasitic capacitance generated between the floating gate 23 and the dielectric layer 28 may be reduced. In this way, the interference caused by the parasitic capacitance may be remarkably reduced.

Also, since the surface of the floating gate 23 and the surface of the isolation layer 27 are disposed at the same height from the substrate 21 in the first embodiment of the present invention, the thickness of the floating gate 23 may be decreased. For example, the floating gate 23 may have a thickness less than approximately 300 Å. When the thickness of the floating gate 23 is decreased, the parasitic capacitance caused by the floating gate 23 may be decreased, and the process margin for forming the trenches 25 for isolation may be increased. Here, in the first embodiment of the present invention, the parasitic capacitance caused by the floating gate 23 may be generated between the floating gate 23 and the active regions 26, between the adjacent floating gate 23 and isolation layer 27, and between the adjacent floating gate 23 and dielectric layer 28.

Meanwhile, when the contact area between the floating gate 23 and the dielectric layer 28 is reduced, the coupling ratio is decreased. Therefore, the dielectric layer 28 may be formed of an insulation layer having a high dielectric rate in the first embodiment of the present invention. The insulation layer having a high dielectric rate may compensate for the deterioration in the coupling ratio caused by the reduced contact area between the floating gate 23 and the dielectric layer 28. Here, the insulation layer having a high dielectric rate signifies an insulation layer having a greater dielectric constant than a silicon oxide layer.

Figure 3A:
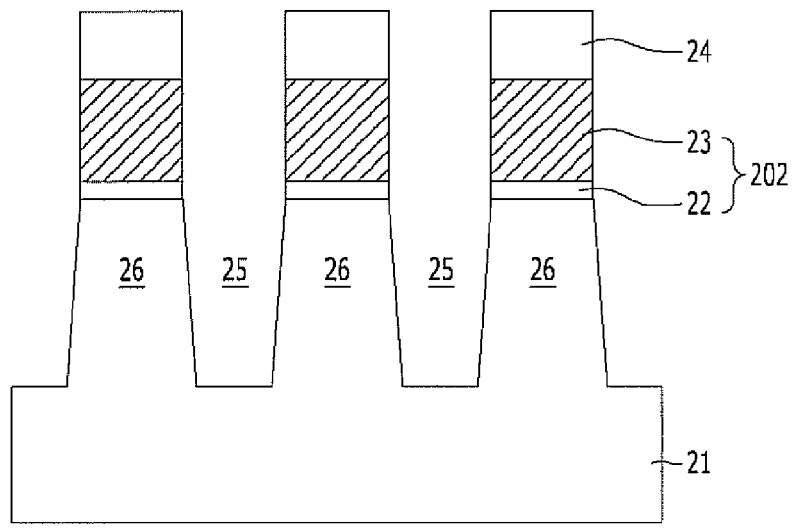
FIGS. 3A to 3C are cross-sectional views describing a method for fabricating the non-volatile memory device in accordance with the first embodiment of the present invention.
Figure 3B:
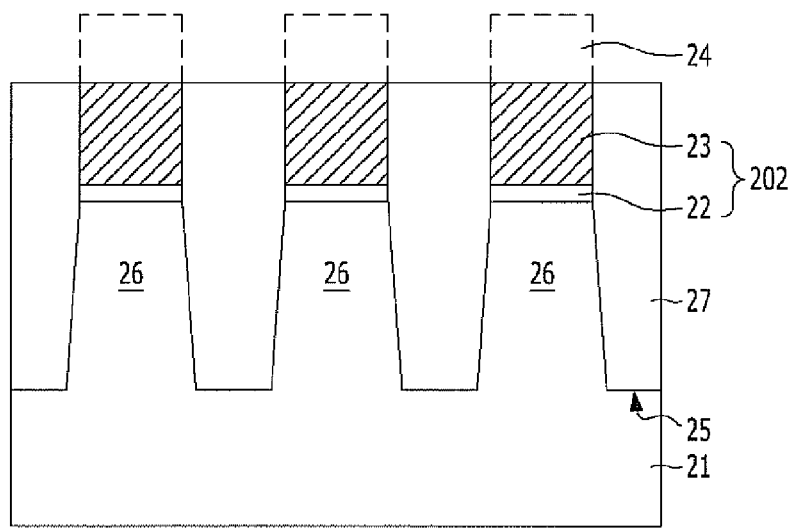
Figure 3C:
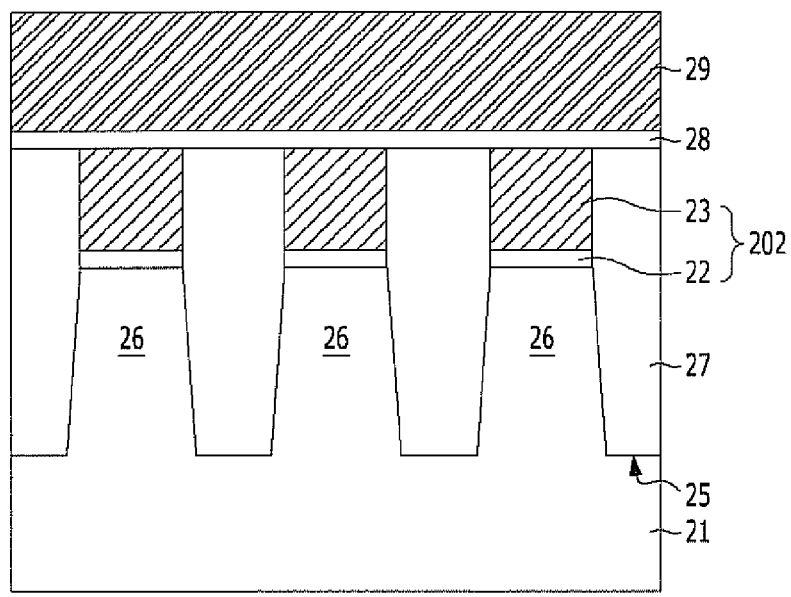

FIGS. 3A to 3C are cross-sectional views describing a method for fabricating the non-volatile memory device in accordance with the first embodiment of the present invention.

Referring to FIG. 3A, a tunnel insulation layer 22, a floating gate conductive layer, and a hard mask pattern 24 are sequentially formed over a substrate 21. Subsequently, the floating gate conductive layer, the tunnel insulation layer 22, and the substrate 21 are etched using the hard mask pattern 24 as an etch barrier so as to form trenches 25 for isolation as well as stacked patterns 202 where the etched tunnel insulation layer 22 and a floating gate 23 are sequentially stacked. Since the trenches 25 for isolation are formed, a plurality of active regions 26 are defined over the substrate 21.

The substrate 21 may be a silicon substrate. The tunnel insulation layer 22 may be an oxide layer, which may be formed through a thermal oxidation process. The floating gate 23 may be a silicon layer, for example, a polysilicon layer. The floating gate 23 is formed to have a thickness less than approximately 300 Å. Here, since the thickness of the floating gate 23 may be decreased thinner than that of the conventional technology, the process margin for forming the trenches 25 may be increased.

Referring to FIG. 3B, an insulation layer is deposited over the substrate 21 to gap-fill the trenches 25 and the space between the stacked patterns 202, and an isolation layer 27 is formed by performing a planarization process until the floating gate 23 is exposed. Therefore, at a moment when the planarization process is ended, the surface of the floating gate 23 and the surface of the isolation layer 27 are aligned with each other.

The planarization process for forming the isolation layer 27 may be an etch process or a Chemical Mechanical Polishing (CMP) process alone, or it may be a combination of an etch process and a CMP process. For example, a CMP process may be performed until the hard mask pattern 24 is exposed and then an etch process, e.g., an etch-back process, may be performed until the floating gate 23 is exposed.

The isolation layer 27 may be an oxide layer. For example, the isolation layer 27 may be a single layer formed of a polysilazane-based Spin-On Dielectric (SOD) layer or a stacked layer where an SOD layer and a High-Density Plasma (HDP) oxide layer are stacked.

Referring to FIG. 3C, a dielectric layer 28 is formed over the planarized surface including the surface of the floating gate 23 and the surface of the isolation layer 27. Here, the dielectric layer 28 may be formed of an insulation layer having a high dielectric rate in order to compensate for the decrease in the coupling ratio, which may be caused because the contact area between the floating gate 23 and the dielectric layer 28 decreases due to the alignment of the surface of the floating gate 23 and the surface of the isolation layer 27.

Here, since the dielectric layer 28 is formed on the planarized surface, the process margin for forming the dielectric layer 28 may be increased. Since the dielectric layer 16 is formed along the surface of the structure including the floating gate 15 which protrudes from the isolation layer 12 in FIG. 1, it is difficult to form the dielectric layer 16 of a uniform thickness. Also, it is difficult to secure the proper process margin because the space for forming the dielectric layer 28 decreases as the integration degree of a semiconductor device increases. According to the embodiment of the present invention, however, the dielectric layer 28 is formed on the planarized surface. Thus, it is easy to form the dielectric layer 28 of the uniform thickness over the substrate structure. Also, the process margin for the dielectric layer 28 may be prevented from decreasing because there is less spatial restriction in the formation of the dielectric layer 28 although the integration degree increases.

Subsequently, a control gate 29 is formed over the dielectric layer 28. The control gate 29 may be a silicon layer, a metallic layer, or a stacked structure where a silicon layer and a metallic layer are stacked. Here, the metallic layer includes a metal layer, a metal oxide layer, a metal nitride layer, and a metal silicide layer.

Through the above-described process, a non-volatile memory device may be fabricated without deterioration in the characteristics of the non-volatile memory device, which otherwise may be caused due to interference caused by the parasitic capacitance between the adjacent floating gate 23 and dielectric layer 28.

Figure 4:
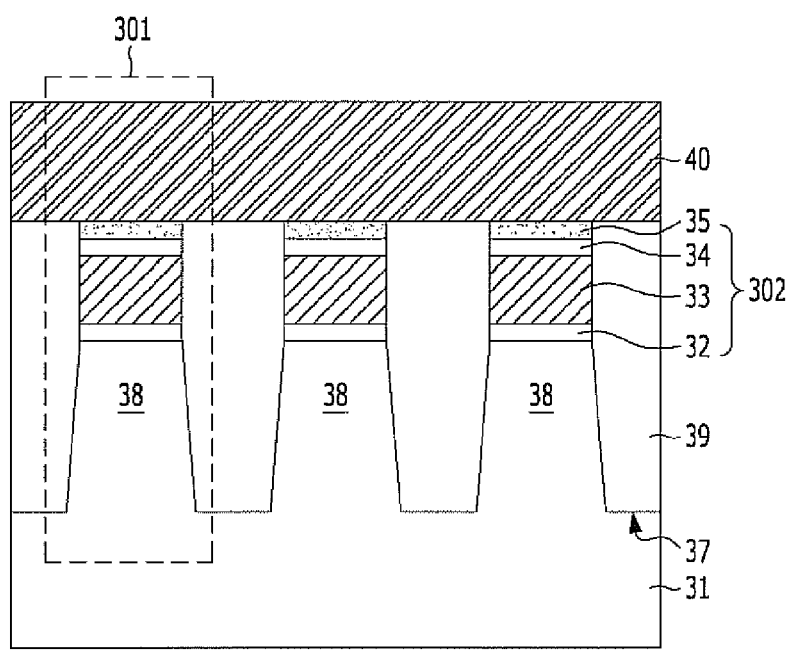
FIG. 4 is a cross-sectional view illustrating a non-volatile memory device in accordance with a second embodiment of the present invention.

FIG. 4 is a cross-sectional view illustrating a non-volatile memory device in accordance with a second embodiment of the present invention.

Referring to FIG. 4, the non-volatile memory device in accordance with the second embodiment of the present invention includes: a plurality of stacked patterns 302, trenches 37, an isolation layer 39, and a control gate 40. The stacked patterns 302 include a tunnel insulation layer 32, a floating gate 33, and a dielectric layer 34 sequentially stacked over a substrate 31 of active regions 38. The trenches 37 are formed in the substrate 31 between the stacked patterns 302. The isolation layer 39 gap-fills the trenches 37 between the stacked patterns 302 and defines the active regions 38. The control gate 40 is formed over the dielectric layer 34. Here, in the stacked patterns 302, the dielectric layer 34 is disposed over the floating gate 33 and the stacked patterns 302 may further include a capping layer 35 interposed between the control gate 40 and the dielectric layer 34. The capping layer 35 protects the dielectric layer 34 during a process. The capping layer 35 may be a conductive layer.

Since the non-volatile memory device in accordance with the second embodiment of the present invention having the above-described structure includes the dielectric layer 34 over the floating gate 33, parasitic capacitance between the adjacent floating gate 33 and dielectric layer 34 may be removed. Therefore, the non-volatile memory device in accordance with the second embodiment of the present invention may reduce the parasitic capacitance between adjacent cells 301 and the interference caused by the parasitic capacitance even more remarkably than the non-volatile memory device in accordance with the first embodiment of the present invention.

To be specific, according to the first embodiment of the present invention, since the dielectric layer 28 extends over adjacent floating gates 23, the parasitic capacitance is caused between the adjacent floating gate 23 and dielectric layer 28. However, according to the second embodiment of the present invention, since the dielectric layer 34 disposed over the adjacent floating gates 33 is separated therebetween, the generation of parasitic capacitance between the adjacent floating gate 33 and dielectric layer 34 may be prevented. To sum up, since the generation of parasitic capacitance between the adjacent floating gate 33 and dielectric layer 34 is prevented, the interference caused by the parasitic capacitance may be remarkably reduced.

Also, since the dielectric layer 34 is formed to be disposed over the floating gate 33 in the second embodiment of the present invention, the thickness of the floating gate 33 may be decreased, compared with a conventional non-volatile memory device. For example, the floating gate 33 may have a thickness of approximately 300 Å or less. When the thickness of the floating gate 33 is decreased, the parasitic capacitance caused by the floating gate 33 may be reduced as well, and furthermore, the process margin for forming the trenches 37 may be increased. Here, the parasitic capacitance caused by the floating gate 33 may occur between the floating gate 33 and the active regions 38 and between the adjacent floating gate 33 and isolation layer 39 in the second embodiment of the present invention.

Meanwhile, when the contact area between the floating gate 33 and the dielectric layer 34 is decreased, the coupling ratio may be deteriorated. Therefore, the dielectric layer 34 may be formed of an insulation layer having a high dielectric rate in the second embodiment of the present invention. The insulation layer having a high dielectric rate may compensate for the deterioration of the coupling ratio resulting from the decreased contact area between the floating gate 33 and the dielectric layer 34. Here, the insulation layer having a high dielectric rate means an insulation layer having a greater dielectric constant than a silicon oxide layer.

Figure 5A:
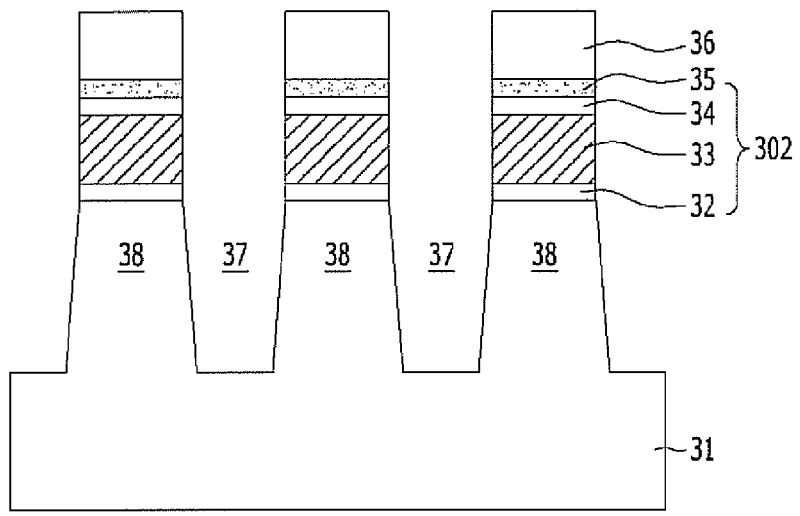
FIGS. 5A to 5C are cross-sectional views describing a method for fabricating the non-volatile memory device in accordance with the second embodiment of the present invention.
Figure 5B:
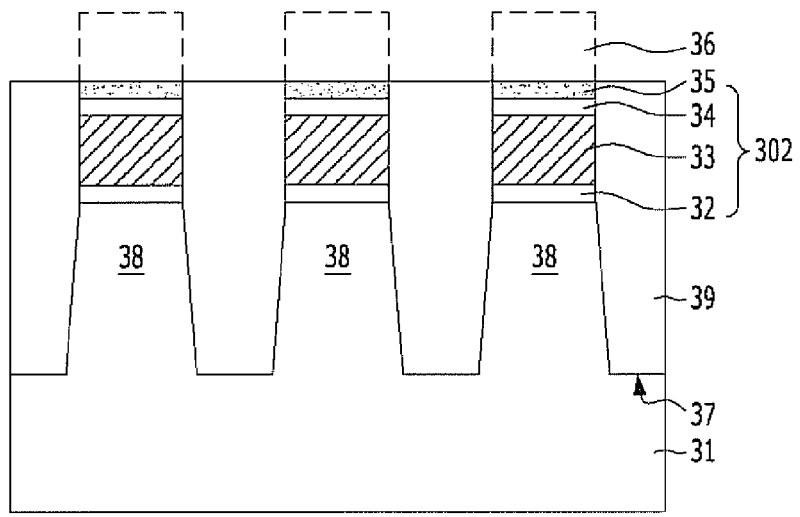
Figure 5C:
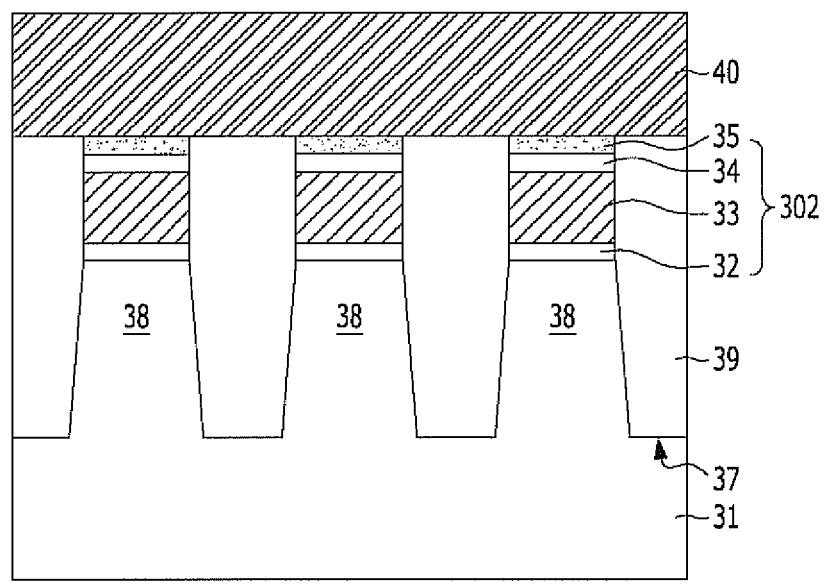

FIGS. 5A to 5C are cross-sectional views describing a method for fabricating the non-volatile memory device in accordance with the second embodiment of the present invention.

Referring to FIG. 5A, a staked layer where a tunnel insulation layer 32, a floating gate conductive layer, a dielectric layer 34, and a capping layer 35 are sequentially stacked is formed over a substrate 31. Subsequently, the stacked layer and the substrate 31 are etched by using a hard mask pattern 36 over the stacked layer as an etch barrier so as to form trenches 37 for isolation as well as a plurality of stacked patterns 302 where the tunnel insulation layer 32, a floating gate 33, the dielectric layer 34, and the capping layer 35 are sequentially stacked. Also, as the trenches 37 for isolation are formed, a plurality of active regions 38 are defined in the substrate 31.

The substrate 31 may be a silicon substrate. The tunnel insulation layer 32 may be an oxide layer, and the oxide layer may be formed through a thermal oxidation process. The floating gate 33 may be a silicon layer, for example, a polysilicon layer. The floating gate 33 may be formed to have a thickness of approximately 300 Å or less, which is thinner than conventional one. Since the thickness of the floating gate 33 may be decreased, compared with a conventional non-volatile memory device, the process margin for forming the trenches 37 may be increased. The dielectric layer 34 may be formed of an insulation layer having a high dielectric rate in order to compensate for a decrease in the coupling ratio, which may result from the dielectric layer 34 remaining over the floating gate 33. The capping layer 35 protects the dielectric layer 34 during a process, and the capping layer 35 may be a conductive layer or an insulation layer.

Referring to FIG. 5B, an insulation layer is deposited over the substrate 31 to gap-fill the trenches 37 and the space between the stacked patterns 302, and then a planarization process is performed until the capping layer 35 is exposed so as to form an isolation layer 39.

The planarization process for forming the isolation layer 39 may be an etch process or a Chemical Mechanical Polishing (CMP) process alone, or a combination of an etch process and a CMP process. For example, a CMP process may be performed until the hard mask pattern 36 is exposed, and then an etch process, e.g., an etch-back process, may be performed until the capping layer 35 is exposed.

The isolation layer 39 may be an oxide layer. For example, the isolation layer 39 may be a single layer formed of a polysilazane-based Spin-On Dielectric (SOD) layer or a stacked layer of an SOD layer and a High-Density Plasma (HDP) oxide layer.

Referring to FIG. 5C, the control gate 40 is formed over the substrate structure including the isolation layer 39. The control gate 40 may be a silicon layer, a metallic layer, or a stacked layer where a silicon layer and a metallic layer are stacked. Here, the metallic layer includes a metal layer, a metal oxide layer, a metal nitride layer, and a metal silicide layer.

Meanwhile, when the capping layer 35 is formed of an insulation layer, the capping layer 35 is removed before the control gate 40 is formed. When the capping layer 35 is formed of a conductive layer, the control gate 40 may be formed while the capping layer 35 remains. In some cases, although the capping layer 35 is formed of a conductive layer, the control gate 40 is formed after the capping layer 35 is removed.

Through the process described above, a non-volatile memory device may prevent its characteristics from being deteriorated due to the interference resulting from the parasitic capacitance caused between the adjacent floating gate 33 and dielectric layer 34.

According to one embodiment of the present invention, since a stacked pattern is separated by an isolation layer and a dielectric layer remains on a floating gate, parasitic capacitance is prevented from being generated between the adjacent floating gate and dielectric layer and thus the characteristics of a non-volatile memory device are protected/prevented from being deteriorated due to the interference caused by the parasitic capacitance.

While the present invention has been described with respect to the specific embodiments, it will be apparent to those skilled in the art that various changes and modifications may be made without departing from the spirit and scope of the invention as defined in the following claims.

What is claimed is:

1. A non-volatile memory device, comprising:
a plurality of stacked patterns comprising a tunnel insulation layer, a floating gate, and a dielectric layer sequentially stacked and formed over a substrate;
trenches formed in the substrate between the stacked patterns;
an isolation layer gap-filling the trenches and space between the stacked patterns; and
a control gate formed over the dielectric layer,
wherein a surface of the floating gate is aligned with a surface of the isolation layer.

2. The non-volatile memory device of claim 1, wherein the dielectric layers of the stacked patterns are separated by the isolation layer.

3. The non-volatile memory device of claim 1, wherein the dielectric layer comprises an insulation layer having a high dielectric rate.

4. The non-volatile memory device of claim 1, wherein the dielectric layer is disposed over the aligned surface of the floating gate and the isolation layer.

5. A method for fabricating a non-volatile memory device, comprising:
forming a plurality of stacked patterns where a tunnel insulation layer, a floating gate, a dielectric layer, and a capping layer are sequentially stacked over a substrate;
forming trenches by etching the substrate between the stacked patterns;
forming an isolation layer gap-filling the trenches and space between the stacked patterns, wherein a surface of the capping layer is aligned with a surface of the isolation layer; and
forming a control gate over the stacked patterns.

6. The method of claim 5, wherein the forming of the stacked patterns comprises:
forming a stacked layer by sequentially stacking the tunnel insulation layer, a floating gate conductive layer, the dielectric layer, and the capping layer over the substrate;
forming a hard mask pattern over the stacked layer; and
etching the stacked layer by using the hard mask pattern as an etch barrier.

7. The method of claim 6, wherein in the forming of the trenches,
the substrate is etched by using the hard mask pattern as an etch barrier after the forming of the stacked patterns.

8. The method of claim 5, wherein the forming of the isolation layer comprises:
forming an insulation layer over the substrate; and
performing a planarization process onto the insulation layer until the capping layer is exposed.

9. The method of claim 8, wherein in the performing of the planarization process,
an etch process or a chemical mechanical polishing (CMP) process is performed alone, or a combination of the etch process and the CMP process is performed.

10. The method of claim 5, wherein the capping layer is an insulation layer or a conductive layer.

11. The method of claim 5, further comprising:
removing the capping layer before the forming of the control gate.

12. A method for fabricating a non-volatile memory device, comprising:
forming floating gates over active regions of a substrate;
forming an isolation layer by gap-filling spaces between the floating gates and between the active regions of the substrate, wherein surfaces of the floating gates are aligned with a surface of the isolation layer; and
forming a control gate over the aligned surface.

13. The method of claim 12, wherein the forming of the floating gates comprises:
sequentially forming a tunnel insulation layer, a floating gate conductive layer, a dielectric layer, and a hard mask pattern over the substrate; and
etching the dielectric layer, the floating gate conductive layer, the tunnel insulation layer, and the substrate by using the hard mask pattern as an etch barrier to form the floating gates and trenches in the substrate.

14. The method of claim 12, further comprising forming a dielectric layer over the aligned surface before the forming of the control gate.

15. A non-volatile memory device, comprising:
a plurality of stacked patterns comprising a tunnel insulation layer, a floating gate, a dielectric layer and a capping layer sequentially stacked and formed over a substrate;
trenches formed in the substrate between the stacked patterns;
an isolation layer gap-filling the trenches and space between the stacked patterns; and
a control gate formed over the stacked patterns,
wherein a surface of the capping layer is aligned with a surface of the isolation layer.

16. The non-volatile memory device of claim 15, wherein the capping layer comprises a conductive layer.

17. The non-volatile memory device of claim 15, wherein the dielectric layers of the stacked patterns are separated by the isolation layer.

18. The non-volatile memory device of claim 15, wherein the dielectric layer comprises an insulation layer having a high dielectric rate.

19. The non-volatile memory device of claim 15, wherein the control gate is disposed over the aligned surface of the capping layer and the isolation layer.

* * * * *